United States Patent [19]

Pelgrom et al.

[11] Patent Number: 4,599,710
[45] Date of Patent: Jul. 8, 1986

[54] INTEGRATED MEMORY CIRCUIT OF A SERIES-PARALLEL-SERIES TYPE

[75] Inventors: Marcellinus J. M. Pelgrom; Johannes G. Raven; Jan W. Slotboom; Hendrik A. Harwig; Marcellinus J. J. C. Annegarn, all of Eindhoven, Netherlands

[73] Assignee: U.S. Philips Corporation, New York, N.Y.

[21] Appl. No.: 605,958

[22] Filed: May 1, 1984

[30] Foreign Application Priority Data

May 6, 1983 [NL] Netherlands ............... 8301603

[51] Int. Cl.⁴ ............................................. Q11C 11/40
[52] U.S. Cl. ........................................ 365/238; 365/189
[58] Field of Search ............... 365/238, 189, 239, 240

[56] References Cited

U.S. PATENT DOCUMENTS 3,763,480 10/1973 Welmer .............................. 365/238

Primary Examiner—Terrell W. Fears
Attorney, Agent, or Firm—Thomas A. Briody; William J. Streeter; Edward W. Goodman

[57] ABSTRACT

In a series-parallel-series memory circuit (3) which requires a write clock signal (at 19), a transfer clock signal (at 25) and a read clock signal (at 31), it is sufficient, because a clock signal processing circuit (23) is provided, to apply only two clock signals (to 33 and 35). Using a gate circuit (41), it is possible to obtain from one clock signal (applied to 35) additional information, which is provided by means of pulse duration variation, for adapting the time delay of the memory circuit (FIG. 1).

6 Claims, 3 Drawing Figures

INTEGRATED MEMORY CIRCUIT OF A SERIES-PARALLEL-SERIES TYPE

BACKGROUND OF THE INVENTION

The invention relates to an integrated memory circuit of a series-parallel-series type comprising a write register, a transfer circuit having a plurality of transfer registers which are operative in parallel in the operating state, and a read register, the write register being controllable by a write clock signal of a write clock signal frequency, the transfer circuit by a transfer clock signal of a transfer clock signal frequency and the read register by a read clock signal of a read clock signal frequency.

Funkschau 1977, Volume 17, pages 56–60 discloses an integrated memory circuit of the above-described type.

SUMMARY OF THE INVENTION

The invention has for its object to reduce the number of connecting pins of such a memory circuit while preserving substantially all the fields of application.

According to the invention, an integrated memory circuit of the type set forth in the opening paragraph is characterized in that the memory circuit comprises a clock signal processing circuit having a first input for a signal of the write or read clock signal frequency coupled to a first clock signal input of the memory circuit and a second input for a signal of the transfer clock signal frequency coupled to a second clock signal input of the memory circuit, a first output for the write clock signal, a second output for the transfer clock signal and a third output for the read clock signal, the clock signal processing circuit being arranged for deriving only from the signals at the first and second inputs the write, transfer and read clock signals.

So now two pins instead of three pins are sufficient for applying the required clock signals, while so far no application has been found which can be carried out with the prior art memory circuit but not with the memory circuit according to the invention.

DESCRIPTION OF THE DRAWINGS

The invention will now be described in greater detail by way of example with reference to the accompanying drawings.

In the drawings.

DESCRIPTION OF THE PREFERRED EMBODIMENT

Figure 1:
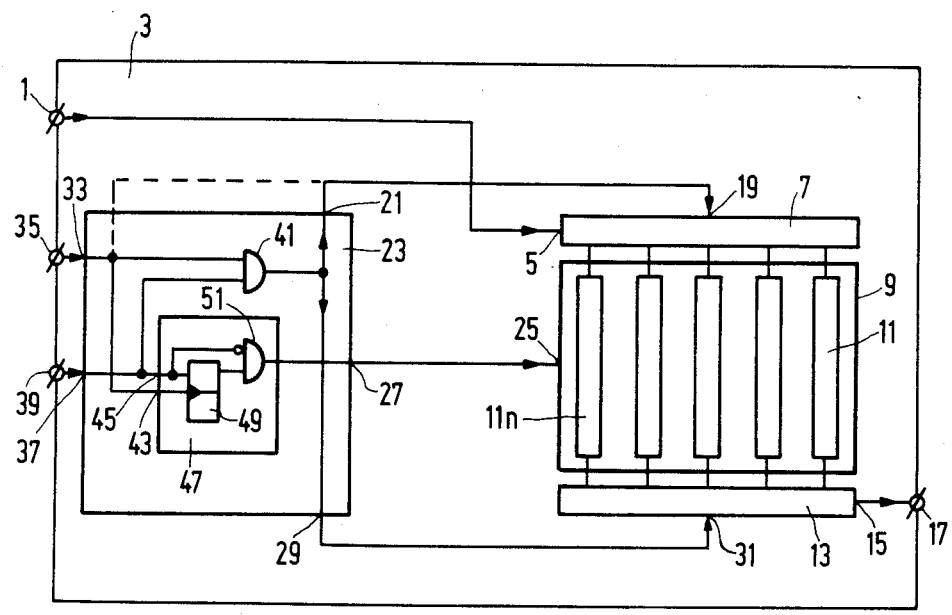
FIG. 1 illustrates, by means of a concise block diagram, an integrated memory circuit according to the invention.
Figure 2:
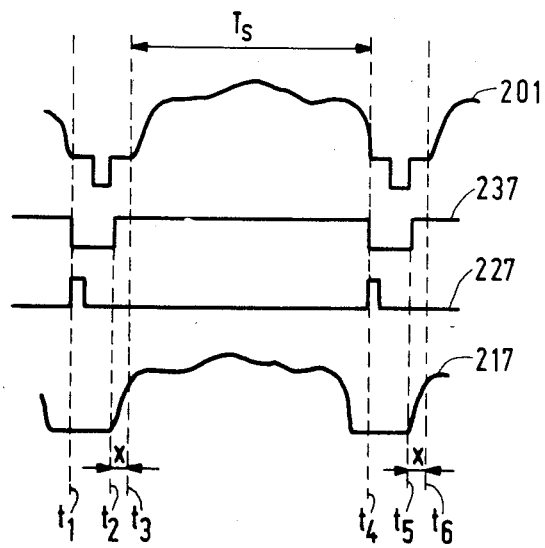
FIG. 2 illustrates, by means of some waveforms, the operation of the memory circuit of FIG. 1.

In FIG. 1 a video signal, which is illustrated in FIG. 2 by means of a waveform 201, is applied to an input 1 of an integrated memory circuit 3.

The input 1 of the memory circuit 3 is connected to an input 5 of a write register 7. The write register 7 is connected via a transfer circuit 9 having a number of parallel operating transfer registers 11 to $11_n$ to a read register 13, an output 15 of which is connected to an output 17 of the memory circuit 3.

In FIG. 2 a waveform 217 illustrates the video signal at the output 17 of the memory circuit 3 if this memory circuit is used as a field delay circuit having a time delay of, for example, a field period minus half a line period.

The write register 7 has a write clock signal input 19, which receives a write clock signal from a first output 21 of a clock signal processing circuit 23.

The transfer circuit 9 has a transfer clock signal input 25 which, from a second output 27 of the clock signal processing circuit, receives a clock signal which is illustrated in FIG. 2 by means of a waveform 227.

From a third output 29 of the clock signal processing circuit 23, a read clock signal is obtained which is applied to a read clock signal input 31 of the read register 13.

The clock signal processing circuit 23 has a first input 33, connected to a pin 35, which serves as a first clock signal input of the memory circuit 3 and a second input 37, connected to a pin 39, which serves as a second clock signal input of the memory circuit 3. A first clock signal, which has a high write or read clock frequency and is not shown in FIG. 2, is applied to the first input 33 of the clock signal processing circuit 23, and a second clock signal, which has a low transfer clock frequency and is illustrated in FIG. 2 by means of a waveform 237, is applied to the second input 37 of the clock signal processing circuit 23.

In the clock signal processing circuit 23, the inputs 33 and 37 are connected to the inputs of an AND-gate 41 whose output is connected to the outputs 21 and 29 of the clock signal processing circuit 23. This causes the first clock signal at these outputs 21 and 29 to occur only during the periods, shown in FIG. 2 as ... $-t_1$, $t_2-t_4$, $t_5-$ ..., in which the second clock signal is high.

The inputs 33 and 37 of the clock signal processing circuit 23 are further connected to inputs 43 and 45, respectively, of an edge detection circuit 47. The input 43 of this edge detection circuit 47 is connected to a clock signal input of a D-filp-flop 49 and the input 45 to an input of this D-flip-flop 49 and to an inverting input of an AND-gate 51, whose other input is connected to an output of the flip-flop 49. The output of the AND-gate 51 is connected to the output 27 of the clock signal processing circuit 23. The D-flip-flop 49 delays the second clock signal applied to the input 45 by a time corresponding to the period of the first clock signal at the input 43, which causes the trailing edges of the second clock signal 237, which edges occur at the instants $t_1, t_4, \ldots$ to produce a pulse at the output 27 as shown in the waveform 227.

These pulses 227 attend to the transfer from the write register 7 to the read register 13 and occur at the end of the writing periods. If it is ensured that these pulses coincide with the end of the line trace period, then at each of these moments a portion of the video signal which occurs in the periods ... $-t_1$, $t_3-t_4$, $t_6-$ ... is stored in the write register 7, these periods having a duration depending on the length of the write register 7, which length is here assumed to be equal to the line trace period $T_s$.

Reading the read register 13 always starts at the instants ..., $t_2, t_5, \ldots$ as a result of which the delay of the memory circuit becomes equal to the field period minus half a line period minus x, where x is the time difference between $t_2$ and $t_3$, $t_5$ and $t_6$, ... By shifting the leading edge in the second clock signal 237, it is not possible to make, for example, the time delay of the memory circuit 3, such that together with delays in signal processing circuits outside the memory circuit 3, these delays become equal to a field period minus half a line period as is required for many circuits.

As the end of the writing periods of the write register 17 is indeed determined by the pulses of the transfer clock signal 227, the write clock signal input 19 of the write register 7 can, if so desired, be connected to the input 33 of the clock signal processing circuit 23 instead of to the output of the AND-gate 41 as shown by means of a dotted line in FIG. 1.

If so desired, different types of circuits performing the same function may alternatively be used for the edge detection circuit 47 and the AND-gate 41.

Since the transfer clock signal 227 is derived from the trailing edges of the second clock signal 237 the periodically temporarily accelerated transfer remains possible in circuits for which the memory length of the memory circuit 3 is too long. This is then effected by increasing periodically and temporarily the frequency of the second clock signal. The information written-in in this period is then not suitable for use, which is not important.

For the sake of clarity, only one phase of the clock signals is shown; when the memory circuit 3 requires multi-phase clock signals these signals can, for example, be generated in known manners.

If the memory circuit is a circuit for processing binary signal combinations then additional, parallel-operating combinations of write, transfer and read registers can be included in the integrated circuit, each register processing a bit of these signal combinations.

Figure 3:
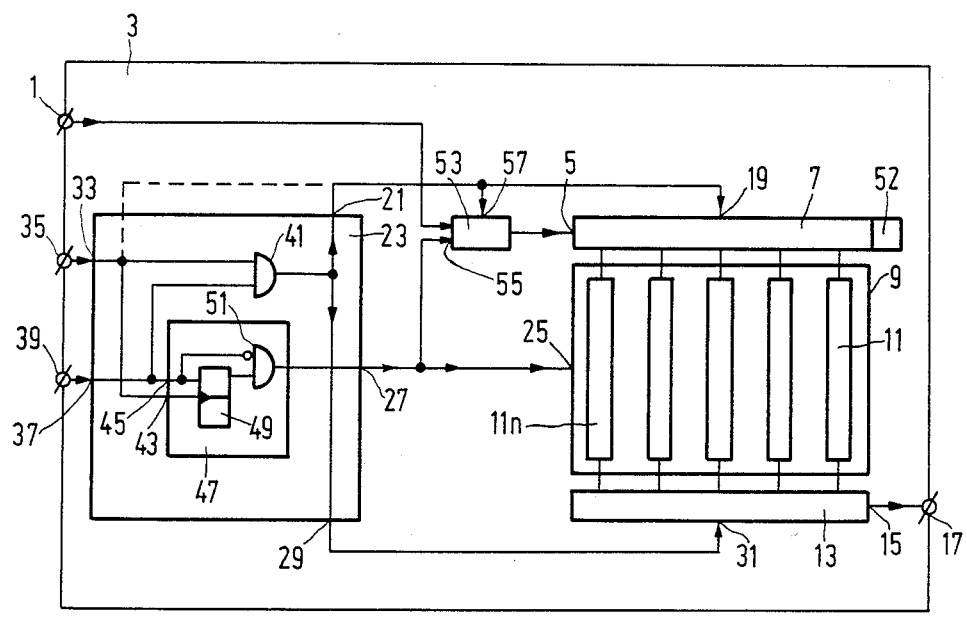
FIG. 3 illustrates, by means of a concise block diagram, a further enlarged construction of the memory circuit shown in FIG. 1.

If the registers are of a charge-coupled type, a charge destruct circuit 52 is preferably included at the end of the write register 7, as shown in FIG. 3, and between the input 1 of the memory circuit 3 and the input 5 of the write register 7, a shift register 53 is arranged which is formed by some flip-flops which are each set by pulses applied to a setting input 55 and originating from the output 27 of the clock signal processing circuit 23 and to which the write clock signal originating from the output 21 of the clock signal processing circuit 23 is applied via a clock signal input 57 of the register 53. As a result thereof, before each occurrence of the portion of the video signal to be written into the write register 7, a plurality of ones are shifted through the transfer register 7, which improves its operation. Some delay in the video signal then occurs but this delay can be compensated for in a simple way as described in the foregoing.

The further portions of FIG. 3 correspond to those of FIG. 1 and are given the same reference numerals.

The reliability of the operation of the clock signal processing circuit 23 can, if so desired, be still further improved by providing a D-flip-flop between the second clock signal input 39 of the memory circuit 3 and the input 37 of the clock signal processing circuit 23. This D-flip-flop must then receive its clock signal from the first clock signal input 35 of the memory circuit 3.

What is claimed is:

1. An integrated memory circuit of a series-parallel-series type comprising a write register, a transfer circuit having a plurality of transfer registers which are operative in parallel in the operating state, and a read register, the write register being controllable by a write clock signal of a write clock signal frequency, the transfer circuit by a transfer clock signal of a transfer clock signal frequency and the read register by a read clock signal of a read clock signal frequency, characterized in that the memory circuit further comprises a clock signal processing circuit having a first input for a signal of the write or read clock signal frequency coupled to a first clock signal input of the memory circuit and a second input for a signal of the transfer clock signal frequency coupled to a second clock signal input of the memory circuit, a first output for the write clock signal, a second output for the transfer clock signal and a third output for the read clock signal, the clock signal processing circuit deriving only from the signals at the first and second inputs the write, transfer and read clock signals.

2. An integrated memory circuit as claimed in claim 1, characeterized in that in the clock signal processing circuit, the third output thereof is connected to the first and second inputs of the clock signal processing circuit via at least a gate circuit.

3. An integrated memory circuit as claimed in claim 1, characterized in that in the clock signal processing circuit, the second output thereof is coupled to the first and second inputs of the clock signal processing circuit via at least an edge detection circuit.

4. An integrated memory circuit as claimed in claim 3, characterized in that the memory circuit is of a charge-coupled type having at the output of the write register a charge destruct circuit and at the input of the write register a shift register having a set input coupled to the second output of the clock signal processing circuit and a clock signal input coupled to the first output of the clock signal processing circuit.

5. An integrated memory circuit as claimed in claim 2, characterized in that in the clock signal processing circuit, the second output thereof is coupled to the first and second inputs of the clock signal processing circuit via at least an edge detection circuit.

6. An integrated memory circuit as claimed in claim 5, characterized in that the memory circuit is of a charge-coupled type having at the output of the write register a charge destruct circuit and at the input of the write register a shift register having a set input coupled to the second output of the clock signal processing circuit and a clock signal input coupled to the first output of the clock signal processing circuit.

* * * * *